United States Patent
Chiang et al.

(10) Patent No.: US 8,181,342 B2
(45) Date of Patent: May 22, 2012

(54) METHOD FOR MANUFACTURING A CORELESS PACKAGING SUBSTRATE

(75) Inventors: Jen-Hung Chiang, Sinfong Township, Hsinchu County (TW); Chao-Meng Cheng, Sinfong Township, Hsinchu County (TW)

(73) Assignee: Unimicron Technology Corp. (TW)

( * ) Notice: Subject to any disclaimer, the term of this patent is extended or adjusted under 35 U.S.C. 154(b) by 246 days.

(21) Appl. No.: 12/654,009

(22) Filed: Dec. 8, 2009

(65) Prior Publication Data

US 2010/0288549 A1 Nov. 18, 2010

(30) Foreign Application Priority Data

May 12, 2009 (TW) .............................. 98115694 A

(51) Int. Cl.
*H01K 3/00* (2006.01)

(52) U.S. Cl. ................ 29/852; 29/830; 29/831; 29/832; 29/846; 29/835

(58) Field of Classification Search .................... 29/852, 29/830, 831, 832, 846, 412, 417, 835; 438/637, 438/107, 612, 618, 382; 174/257, 264, E21, 174/576; 257/E21.512, E23.145, E33.056
See application file for complete search history.

(56) References Cited

U.S. PATENT DOCUMENTS

| | | | | |
|---|---|---|---|---|
| 5,366,906 A | * | 11/1994 | Wojnarowski et al. | 438/17 |
| 5,565,706 A | * | 10/1996 | Miura et al. | 257/723 |
| 5,874,770 A | * | 2/1999 | Saia et al. | 257/536 |
| 7,067,918 B2 | * | 6/2006 | Murata et al. | 257/751 |

* cited by examiner

*Primary Examiner* — Derris Banks
*Assistant Examiner* — Tai Nguyen
(74) *Attorney, Agent, or Firm* — Bacon & Thomas PLLC

(57) ABSTRACT

Disclosed are a coreless packaging substrate and a manufacturing method thereof. The substrate includes a built-up structure and a first wiring layer. The built-up structure has a first outside and an opposite second outside, and includes one or more second dielectric layers and second wiring layers, and a plurality of conductive vias. The second dielectric layers have first and second surfaces respectively facing the first and second outsides. The second wiring layers are disposed on the second surface. The conductive vias are disposed in the second dielectric layer. The outermost second wiring layer at the second outside has a plurality of second conductive pads. The first wiring layer is embedded into and exposed from the first surface of the outermost second dielectric layer at the first outside, and has a plurality of first conductive pads. The conductive vias electrically connect the first wiring layer and the second wiring layer.

15 Claims, 16 Drawing Sheets

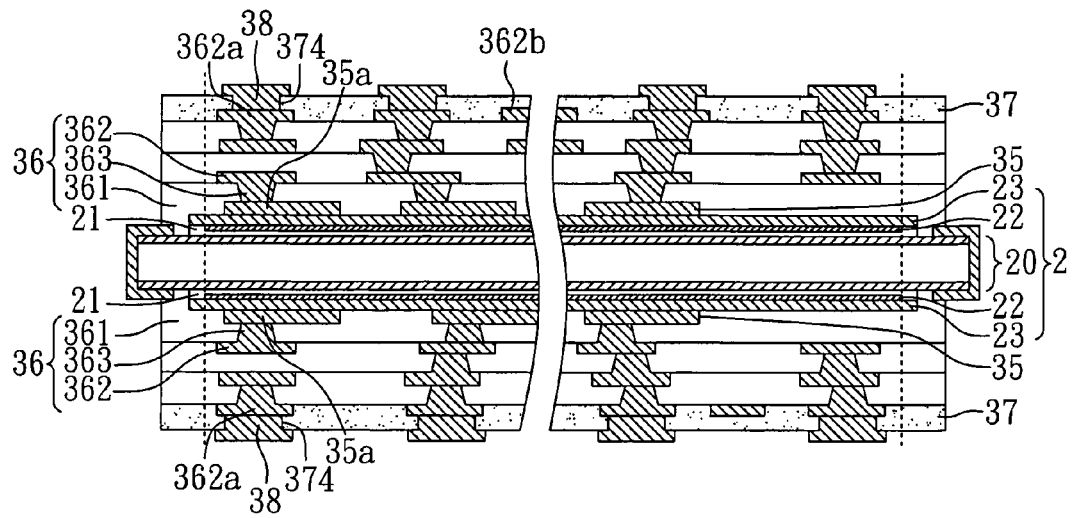
FIG. 3E"
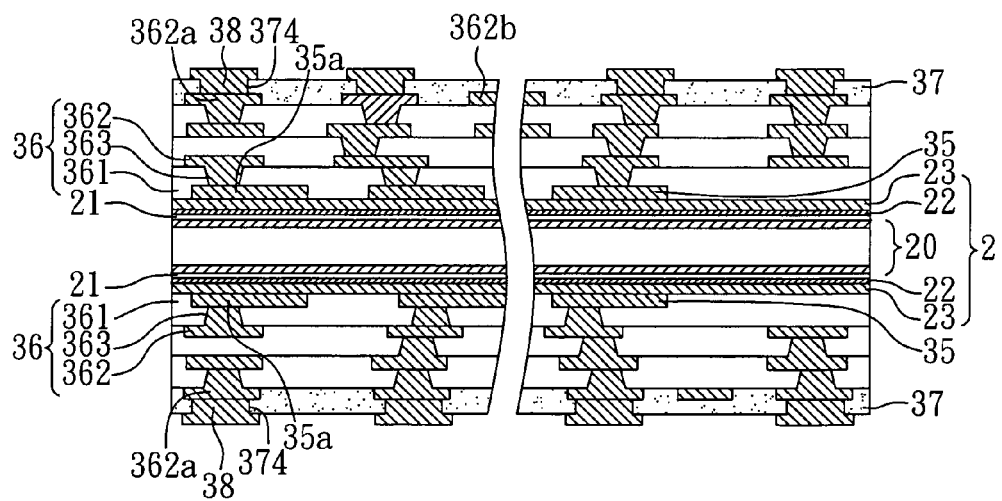
FIG. 3F"

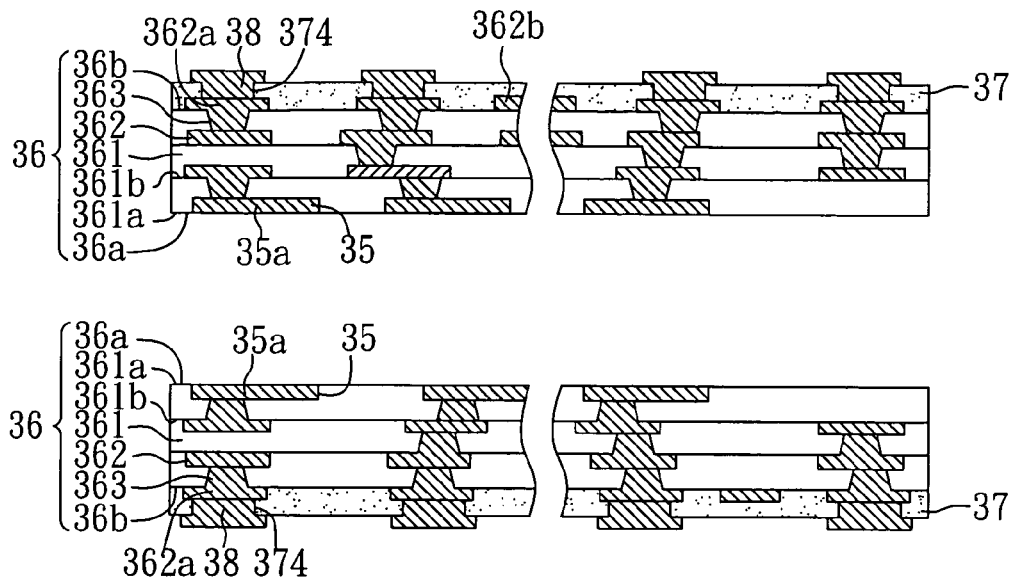
FIG. 3G"
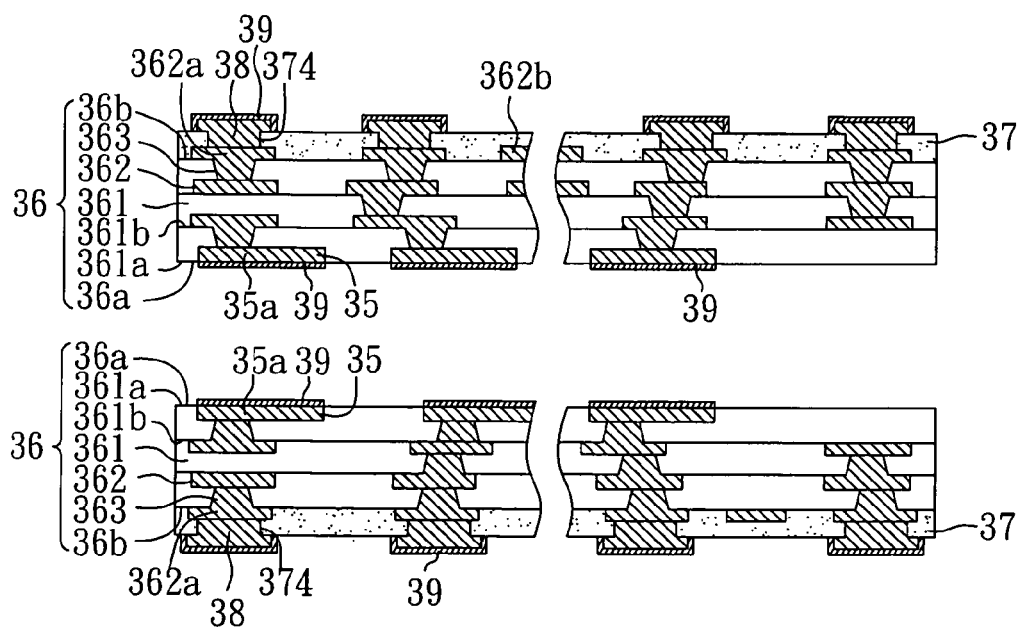
FIG. 3H"

METHOD FOR MANUFACTURING A CORELESS PACKAGING SUBSTRATE

BACKGROUND OF THE INVENTION

1. Field of the Invention

The present invention relates to a carrier, a coreless packaging substrate, and methods for manufacturing the same and, more particularly, to a carrier used for manufacturing a coreless packaging substrate and a manufacturing method thereof, and a coreless packaging substrate manufactured by using the carrier, and a manufacturing method thereof.

2. Description of Related Art

As the electronics industry continues to develop rapidly, the technology of semiconductor packaging accordingly moves towards high integration and miniaturization. In order to meet the demands such as multifunction and high efficiency in electronic devices, packaging substrates, for active and passive components, having many wiring connections thereon have advanced from being single-layered boards to multiple-layered boards. Hence, the space for wiring layout in a limited packaging substrate can be expanded to meet the demand of the application of high-density integrated circuits.

With regard to a conventional process of manufacturing semiconductor devices, a common manufacturer of chip loaders first produces suitable chip loaders for semiconductor devices, such as packaging substrates or leadframes. Then, the chip loaders are processed with semiconductor chip attachment, wire bonding, molding, implanting solder balls etc. for completion of semiconductor devices. In detail, a chip is adhered via its back surface to the top surface of a packaging substrate and then electrically connected thereto by wire bonding. Alternatively, a chip is electrically connected via its active surface to the top surface of a packaging substrate by the flip chip technique, followed by underfilling performed between the semiconductor chip and the packaging substrate to protect the electrical connections and to strengthen mechanical connections therebetween. Finally, electrical connections to other electronic devices are achieved by disposing solder balls on the back surface of the substrate.

The abovementioned chip loaders can have a core layer or be a coreless packaging substrate. With reference to FIGS. 1A to 1G, a flowchart shows manufacturing of a conventional coreless packaging substrate. First, as shown in FIGS. 1A and 1B, a carrier 10 is provided and a first dielectric layer 11 is laminated on the carrier 10. Then, a first wiring layer 15 is formed on the first dielectric layer 11, and has a plurality of conductive lands 15a. As shown in FIGS. 1C and 1D, a built-up structure 16 is formed on the first dielectric layer 11 and the first wiring layer 15, and includes a second dielectric layer 161, a second wiring layer 162 disposed on the second dielectric layer 161, and a plurality of conductive vias 163 disposed in the second dielectric layer 161. The built-up structure can have an increased number of layers if necessary.

Subsequently, as shown in FIG. 1E, the carrier 10 underneath the first dielectric layer 11 is removed. Solder masks 17 and 17' are formed respectively on the uncovered surface of the dielectric layer 11—being revealed owing to the removal of the carrier 10—and on the outermost dielectric layer 161 and second wiring layer 162 of the built-up structure 16. Openings 174' are formed in the solder mask 17'. Conductive vias 18a connecting to the conductive lands 15a are formed in the dielectric layer 11, and conductive pads 18b connected to the conductive lands 15a through the conductive vias 18a are formed in openings 174'. Then, openings 174 are formed in the solder mask 17 to expose the first conductive pads 162a. Finally, as shown in FIG. 1G, a surface finish layer 19 is formed on the second conductive pads 18b and the first conductive pads 162a, to thereby obtain a coreless packaging substrate. As shown in FIGS. 1A to 1G, the conventional method is not advantageous to increase the productivity since the coreless packaging substrate can be manufactured only on one side of the carrier 10. Additionally, it is commonly difficult for the carrier 10 underneath the first dielectric layer 11 to be removed from the coreless packaging substrate.

Furthermore, as the trend of the packaging substrate is towards fine pitch, the size of the pads decreases such that the dimension of the openings of the solder mask for exposing the pads also reduces. When the dimension of the openings 174' of the solder mask 17' at the chip bonding side decreases to 50 µm or less, the current photolithography as exposure and development can not exhibit good performance. Moreover, when the solder bumps are formed by stencil printing on the second conductive pads 18b, the decreased dimension of the openings 174' commonly results in voids formed under the solder bumps. Simultaneously, the joint strength between the surface finish layer 19 and the solder weakens due to the reduced joint area. Besides, the aforesaid coreless packaging substrate, without support by a core layer, can not show sufficient rigidity, and thus easily incurs warpage, resulting in poor reliability.

Therefore, it is desirable to provide a coreless packaging substrate and a method for manufacturing the same to lower the possibility of the warpage, to reduce the material consumption, to decrease the costs, and also to improve the reliability.

SUMMARY OF THE INVENTION

In view of the abovementioned, the present invention provides a carrier used for manufacturing a coreless packaging substrate. This carrier includes: a core layer; a first dielectric layer disposed on the core layer; a release film disposed on the first dielectric layer, wherein an area of the release film is smaller than that of the first dielectric layer such that the first dielectric layer has a frame-shaped region not covered by the release film; and a metal layer disposed on the release film and the first dielectric layer, and connected with the frame-shaped region by overlapping.

Referring to the carrier used for manufacturing a coreless packaging substrate mentioned above, the present invention also provides a method for manufacturing the same. This method includes the following steps: providing a core layer; and forming a first dielectric layer, a release film, and a metal layer in sequence on a surface of the core layer, wherein an area of the release film is smaller than that of the dielectric layer such that the dielectric layer has a frame-shaped region not covered by the release film.

In the aforesaid carrier and manufacturing method thereof, the core layer can be a copper-clad laminate (CCL).

Besides, in a case of application of the aforesaid carrier, the present invention also provides a method for manufacturing a coreless packaging substrate. This method includes the following steps: providing a carrier, which comprises a core layer, a first dielectric layer disposed on the core layer, a release film disposed on the first dielectric layer, and a metal layer disposed on the release film and the first dielectric layer, wherein an area of the release film is smaller than that of the first dielectric layer such that the first dielectric layer has a frame-shaped region not covered by the release film and the metal layer is connected with the frame-shaped region by overlapping; forming a first wiring layer on the metal layer of the carrier, wherein the first wiring layer has a plurality of first conductive pads; forming a built-up structure on the first wiring layer and the metal layer, wherein the built-up structure comprises at least one second dielectric layer, at least one second wiring layer disposed on the second dielectric layer, and a plurality of conductive vias disposed in the second dielectric layer, wherein the conductive vias electrically connect the first wiring layer and the second wiring layer, and the outermost second wiring layer has a plurality of second conductive pads; and cutting the built-up structure, the metal layer, the releasing film, and the first dielectric layer along a border of the releasing film, and removing the carrier from the built-up structure such that the first conductive pads are embedded in and exposed from the second dielectric layer.

The aforesaid method can further include the step: forming a surface finish layer on the first and second conductive pads. The surface finish layer can be made of one selected from tin, silver, nickel, gold, chromium/titanium, nickel/gold, nickel/palladium, nickel/palladium/gold, organic solderability preservatives (OSP), electroless nickel/immersion gold (ENIG), electroless nickel/electroless palladium/immersion gold (ENEPIG), and electroless palladium/immersion gold (EPIG).

In another case of application of the aforesaid carrier, the present invention provides a method for manufacturing a coreless packaging substrate. This method includes the following steps: providing a carrier, which comprises a core layer, a first dielectric layer disposed on the core layer, a release film disposed on the first dielectric layer, and a metal layer disposed on the release film and the first dielectric layer, wherein an area of the release film is smaller than that of the first dielectric layer such that the first dielectric layer has a frame-shaped region not covered by the release film and the metal layer is connected with the frame-shaped region by overlapping; forming a first wiring layer on the metal layer of the carrier, wherein the first wiring layer has a plurality of first conductive pads; forming a built-up structure on the first wiring layer and the metal layer, wherein the built-up structure comprises at least one second dielectric layer, at least one second wiring layer disposed on the second dielectric layer, and a plurality of conductive vias disposed in the second dielectric layer, wherein the conductive vias electrically connect the first wiring layer and the second wiring layer, and the outermost second wiring layer has a plurality of second conductive pads; forming an insulating protection layer, wherein the insulating protection layer has a plurality of openings exposing the second conductive pads of the outermost second wiring layer; and cutting the insulating protection layer, the built-up structure, the metal layer, the releasing film, and the first dielectric layer along a border of the releasing film, and removing the carrier from the built-up structure such that the first conductive pads are embedded in and exposed from the second dielectric layer.

The aforesaid method can further include the step: forming a surface finish layer on the second conductive pads exposed from the openings and the first conductive pads. The surface finish layer can be made of one of the materials mentioned hereinbefore.

Before the step of inside-cutting, the abovementioned method can further include the steps: forming a plurality of plated metal bumps on the second conductive pads exposed from the openings, and then forming a surface finish layer on the plated metal bumps and the first conductive pads. The surface finish layer can be made of one of the materials mentioned hereinbefore.

In still another case of application of the aforesaid carrier, the present invention provides a coreless packaging substrate. This coreless packaging substrate includes a built-up structure having a first outside and an opposite second outside, which comprises at least one second dielectric layer having a first surface which faces the first outside and a second surface which faces the second outside, at least one second wiring layer disposed on the second surface of the second dielectric layer, and a plurality of conductive vias disposed in the second dielectric layer, wherein the outermost second wiring layer at the second outside has a plurality of second conductive pads; and a first wiring layer embedded in and exposed from the first surface of the outermost second dielectric layer at the first outside of the built-up structure, and having a plurality of first conductive pads, wherein the conductive vias of the built-up structure electrically connect the first wiring layer and the second wiring layer.

The aforesaid coreless packaging substrate can further include a surface finish layer disposed on the first conductive pads, and disposed on and wrapping the second conductive pads.

The aforesaid coreless packaging substrate can further include an insulating protection layer which locates on the outermost second wiring layer and the second surface of the second dielectric layer at the second outside and has a plurality of openings exposing the second conductive pads, and a surface finish layer which is disposed on the second conductive pads exposed from the openings and on the first conductive pads. Alternatively, the coreless packaging substrate can further include a plurality of plated metal bumps which are disposed on the second conductive pads exposed from the openings, and a surface finish layer which is disposed on the first conductive pads, and is disposed on and wraps the plated metal bumps.

Besides, the second dielectric layer which the first conductive pads are embedded in and exposed from can have a coefficient of thermal expansion (CTE) ranging from 10 to 30 ppm/° C., and a Young's modulus over 8 Gpa. Hence, the rigidity of the coreless packaging substrate can be enhanced and the possibility of packaging substrate warpage also can be lowered. If the first conductive pads are bump pads, the second conductive pads are ball pads. On the other hand, if the first conductive pads are ball pads, the second conductive pads are bump pads.

Accordingly, the abovementioned carrier is designed in the present invention. In the carrier, the release film is disposed such that the carrier can be easily removed from the coreless packaging substrate by a simple step of cutting when the carrier is applied in manufacture of the coreless packaging substrate. Therefore, the duration of the manufacture and the complexity of the processes can be reduced. Likewise, the structure where the release film is disposed between the first dielectric layer and the metal layer in the carrier, can prevent the metal layer peeling off during the manufacture of the built-up structure.

Furthermore, based on the layout of the wiring layer, a solder mask may not be formed but instead, the surface finish layer is formed only on the exposed surface of the bump and ball pads for protection during the manufacture of the coreless packaging substrate through using the carrier of the present invention. Therefore, the warpage owing to difference of CTEs between the two materials can be mitigated in the packaging substrate. Meanwhile, poor development of the opening of the solder mask, occurrence of voids in the subsequent soldering, poor adhesion between solder and pads, etc. can be avoided. In addition, the packaging substrate can still maintain the advantageous of fine wiring, small pitch, high available wiring layout area, good electrical performance, and so forth.

However, it is difficult to eliminate the etching process in both the conventional technique and the present invention. It is particularly difficult in the conventional technique to prevent corrosion of the inside wiring along the interface between the core substrate and the dielectric layer due to the acid solution of the etching step. On the other hand, in the present invention, the acid solution of the etching step only influences the carrier and can not permeate into the coreless packaging substrate to corrode the first wiring layer after the carrier is combined with the dielectric layer of the built-up structure. Furthermore, compared with the conventional packaging substrate with a core layer, the present invention can reduce the waste of space for wiring layout in the coreless packaging substrate because of elimination of forming plated through holes connecting the wiring layers on the both side of a core layer, also paths of signal transduction can be shortened. Hence, diminishment of resistance, crosstalk, signal noise, and signal attenuation can be achieved.

In conclusion, the present invention provides the carrier, the coreless packaging substrate, and the manufacturing method thereof, which can achieve the benefits mentioned above so as to promote the reliability and yield of the packaging substrate.

Other objects, advantages, and novel features of the invention will become more apparent from the following detailed description when taken in conjunction with the accompanying drawings.

BRIEF DESCRIPTION OF THE DRAWINGS

FIG. 2A' is a top view of the first dielectric layer 21 and the release film 22 in the carrier of FIG. 2A;

FIGS. 2A to 2H show a flowchart of a method for manufacturing a coreless packaging substrate in a cross-sectional view in Embodiment 2 of the present invention;

FIGS. 2E' to 2H' show a flowchart of a method for manufacturing a coreless packaging substrate in a cross-sectional view in Embodiment 3 of the present invention;

FIGS. 3E' to 3H' show a flowchart of a method for manufacturing a coreless packaging substrate in a cross-sectional view in Embodiment 5 of the present invention; and FIGS. 3E" to 3H" show a flowchart of a method for manufacturing a coreless packaging substrate in a cross-sectional view in Embodiment 6 of the present invention.

DETAILED DESCRIPTION OF THE PREFERRED EMBODIMENT

Because the specific embodiments illustrate the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

Embodiment 1

Figure 1A:
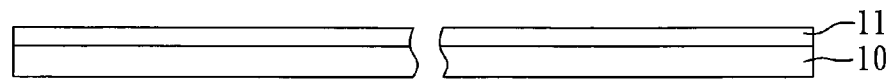
FIGS. 1A to 1G show a flowchart of a method for manufacturing a conventional packaging substrate with a core layer in a cross-sectional view.
Figure 1B:
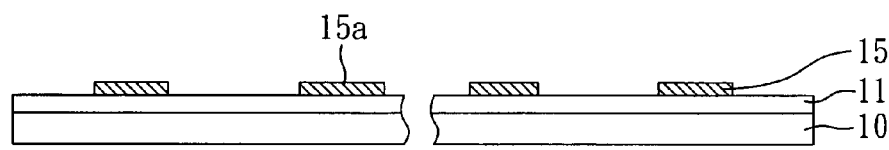
Figure 1C:
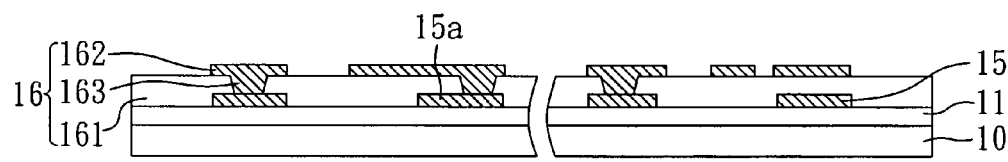
Figure 1D:
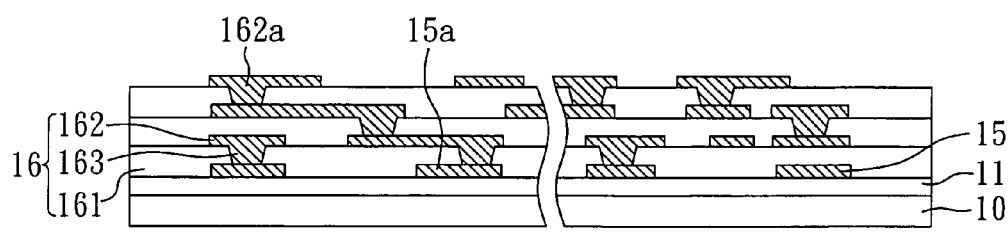
Figure 1E:
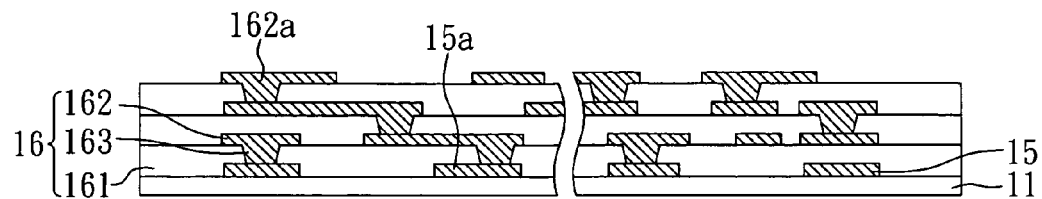
Figure 1F:
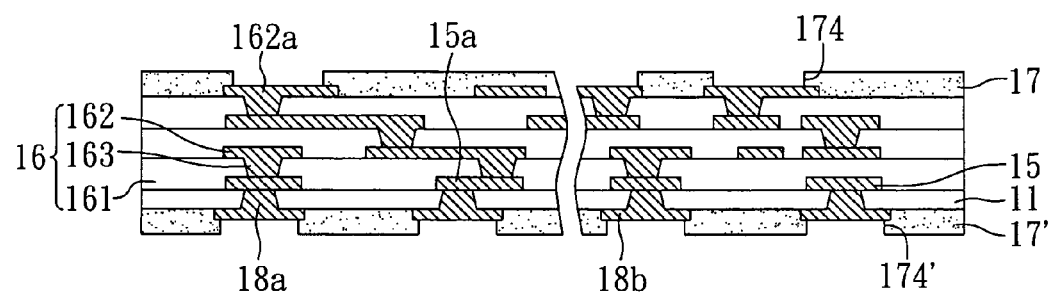
Figure 1G:
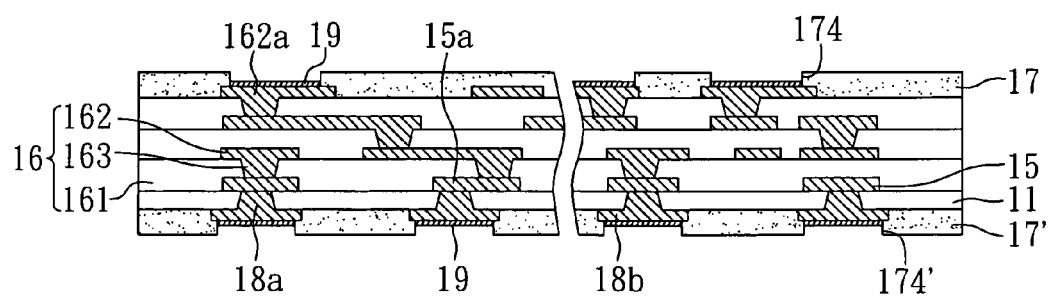
Figure 2A:
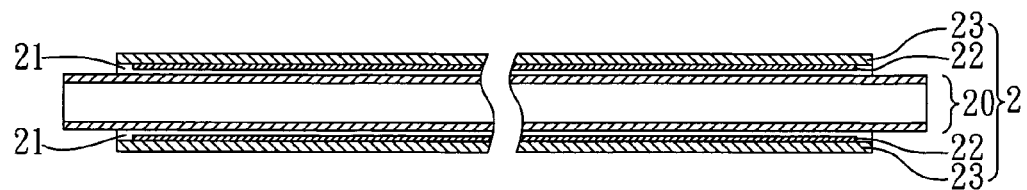
FIG. 2A is a cross-sectional view of a carrier in Embodiment 1 of the present invention.
Figure 2A:
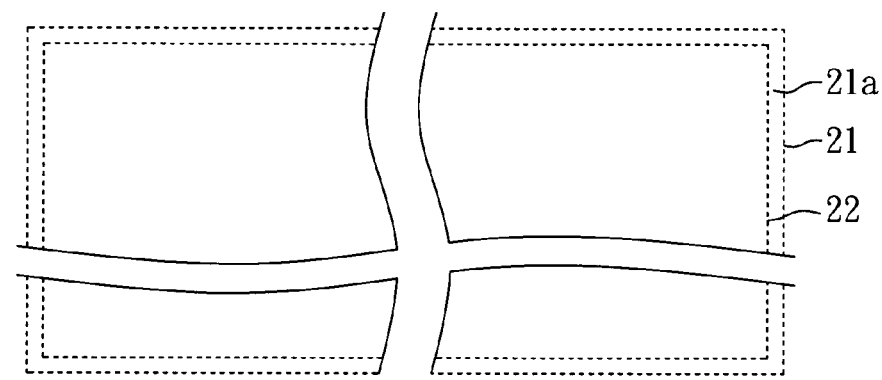

With reference to FIGS. 2A and 2A', FIG. 2A is a cross-sectional view of a carrier used for manufacturing a coreless packaging substrate in the present invention, and FIG. 2A' is a top view of the first dielectric layer 21 and the release film 22 in the carrier of FIG. 2A.

As shown in FIG. 2A, a core layer 20 is provided. For example, the core layer 20 can be a copper-clad laminate, but is not limited thereto. Then, a first dielectric layer 21, a release film 22, and a metal layer 23 are formed in sequence on a surface of the core layer 20. As shown in FIG. 2A', it can be seen that the release film 22 has an area smaller than that of the first dielectric layer 21. Besides, the first dielectric layer 21 has a frame-shaped region 21a not covered by the release film 22. Therefore, the part of the first dielectric layer 21 which is connected with the metal layer 23 by overlapping is the frame-shaped region 21a.

Accordingly, the carrier 2 used for manufacturing a whole-panel coreless packaging substrate, comprises: a core layer 20; a first dielectric layer 21 disposed on the core layer 20; a release film 22 disposed on the first dielectric layer 21, wherein an area of the release film 22 is smaller than that of the first dielectric layer 21 such that the first dielectric layer 21 has a frame-shaped region 21a not covered by the release film 22; and a metal layer 23 disposed on the release film 22 and the first dielectric layer 21, and connected with the frame-shaped region 21a by overlapping.

In conclusion, the release film which is disposed in the carrier of the present invention is advantageous for removal of the carrier when the carrier is applied in the manufacture of the coreless packaging substrate. Therefore, the convenience of the manufacturing processes can be increased. Even if the manufacturing processes are performed on both sides of the carrier of the present invention, the problem of removal difficulty experienced with a conventional carrier does not occur.

Embodiment 2

With reference to FIGS. 2A to 2G, there is a flowchart of a method for manufacturing a coreless packaging substrate in a cross-sectional view in the present invention. In the present embodiment, bump pads embedded in and exposed from the coreless packaging substrate are formed.

First, as shown in FIG. 2A, a carrier 2 is provided. This carrier 2 is the carrier of Embodiment 1 which is used for manufacturing a coreless packaging substrate.

Figure 2B:
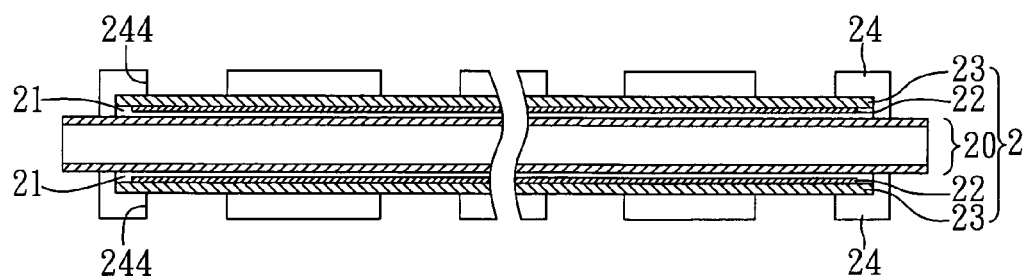
Figure 2C:
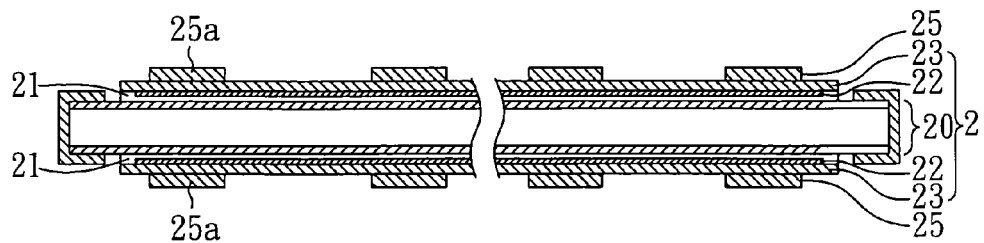

Subsequently, as shown in FIG. 2B, a resist layer 24 is laminated on the core layer 20 and the metal layer 23 of the carrier 2. The resist layer 24 is mainly laminated on the metal layer 23 and over the border of the metal layer 23. The resist layer 24 is patterned by exposure and development to form an open area 244 revealing a part of the metal layer 23. Then, in the open area 244, a first wiring layer 25 is formed by, for example, electroplating. As shown in FIG. 2C, the resist layer 24 is removed. Herein, the first wiring layer 25 has a plurality of first conductive pads 25a. In the present embodiment, the first conductive pads 25a serve as bump pads for electrical connection of a semiconductor chip.

Figure 2D:
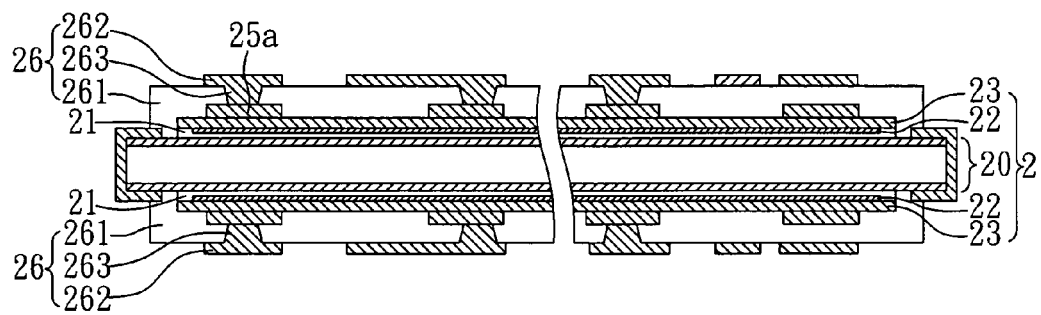
Figure 2E:
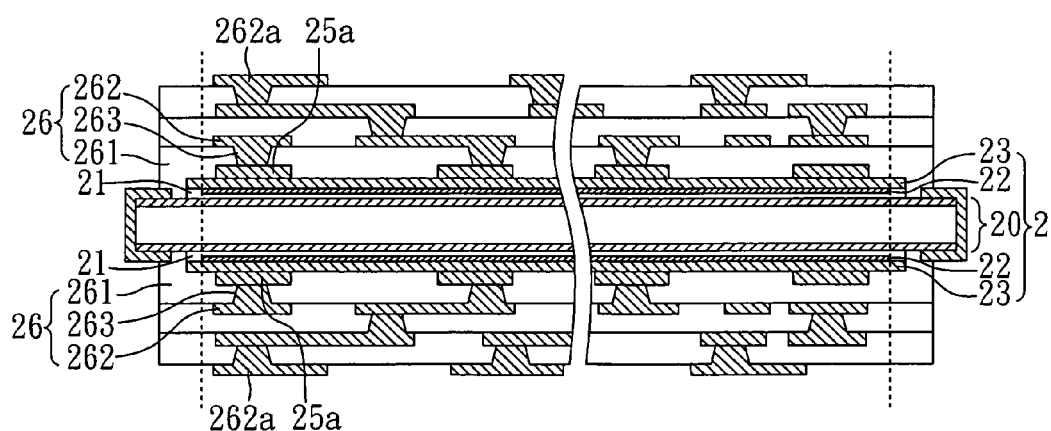
Figure 2E:
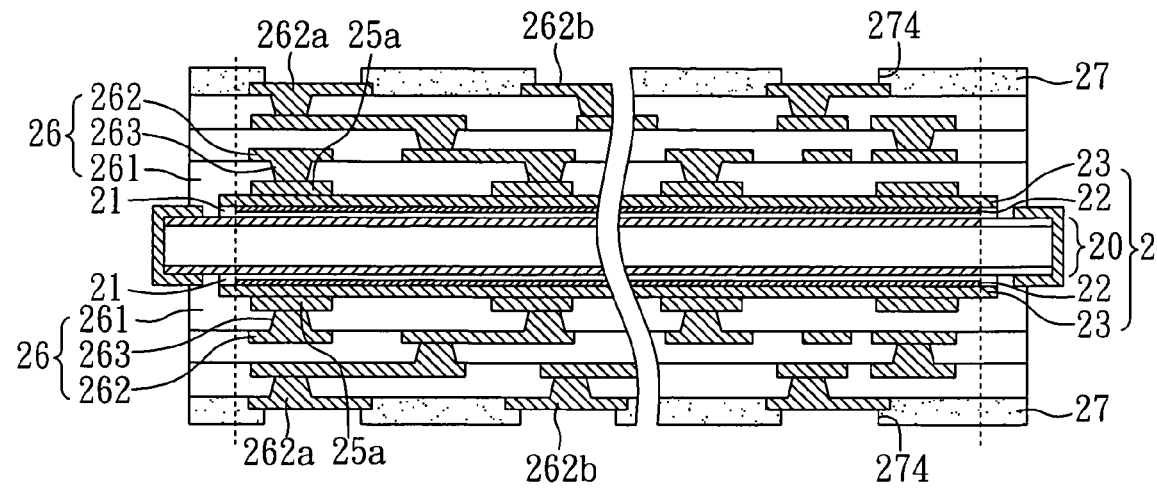

As shown in FIG. 2D, a built-up structure 26 is formed on the first wiring layer 25 and the metal layer 23. The built-up structure 26 includes at least one second dielectric layer 261, at least one second wiring layer 262 disposed on the second dielectric layer 261, and a plurality of conductive vias 263 disposed in the second dielectric layer 261. In the built-up structure 26, the conductive vias 263 electrically connect the first wiring layer 25 and the second wiring layer 262, or electrically connect the second wiring layers 262, as the built-up structure 26 can have an increased number of layers, if more wiring layouts are required, as shown in FIG. 2E. In FIG. 2E, the steps of FIG. 2D are repeated to form second and third layers. In the built-up structure 26, the outermost second wiring layer 262 has a plurality of second conductive pads 262a. In the present embodiment, the second conductive pads 262a serve as ball pads for electrical connection of a printed circuit board. In addition, the second dielectric layer 261 which the first conductive pads 25a are embedded in and exposed from has a coefficient of thermal expansion (CTE) ranging from 10 to 30 ppm/° C., and a Young's modulus over 8 Gpa. For example, Ajinomoto Build-up Film containing glass fibers can be a material of the second dielectric layer 261. Such kind of the materials is beneficial for a whole-panel coreless packaging substrate to increase the rigidity of the substrate and thus to avoid warpage after the coreless packaging substrate is removed from the carrier or even is cut into pieces.

Figure 2F:
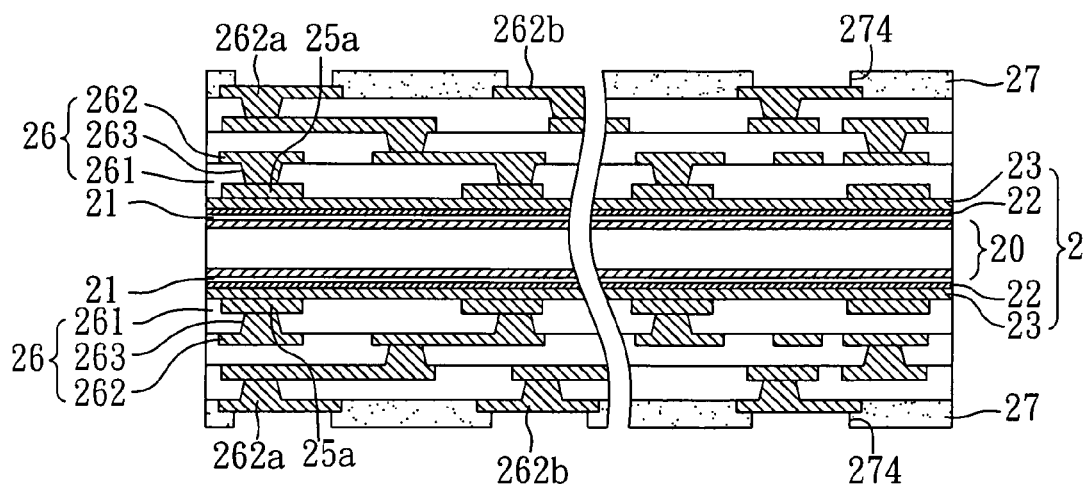
Figure 2F:
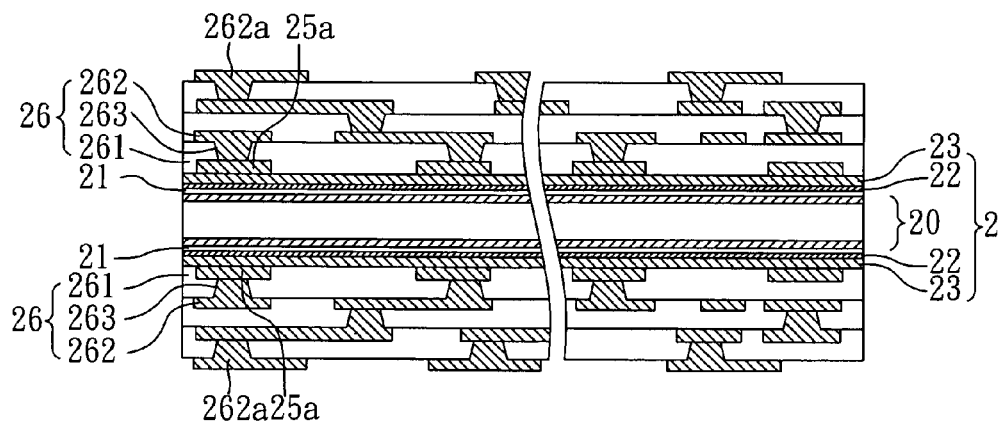
Figure 2G:
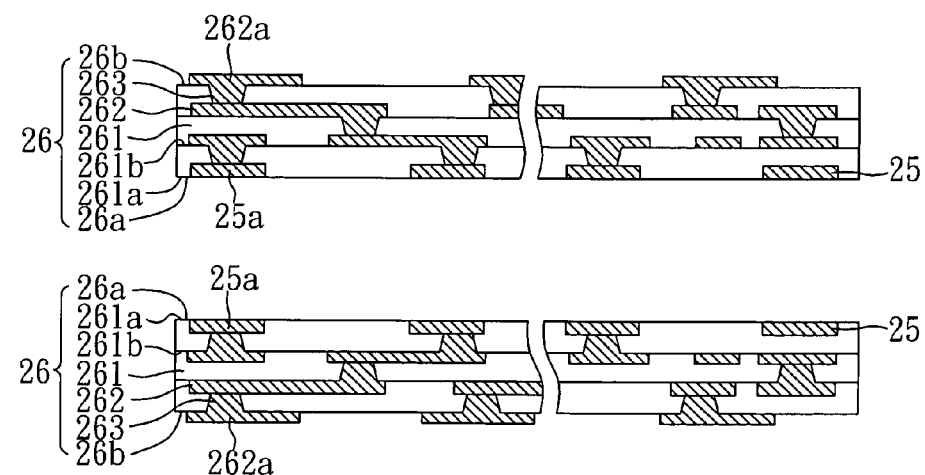
Figure 2G:
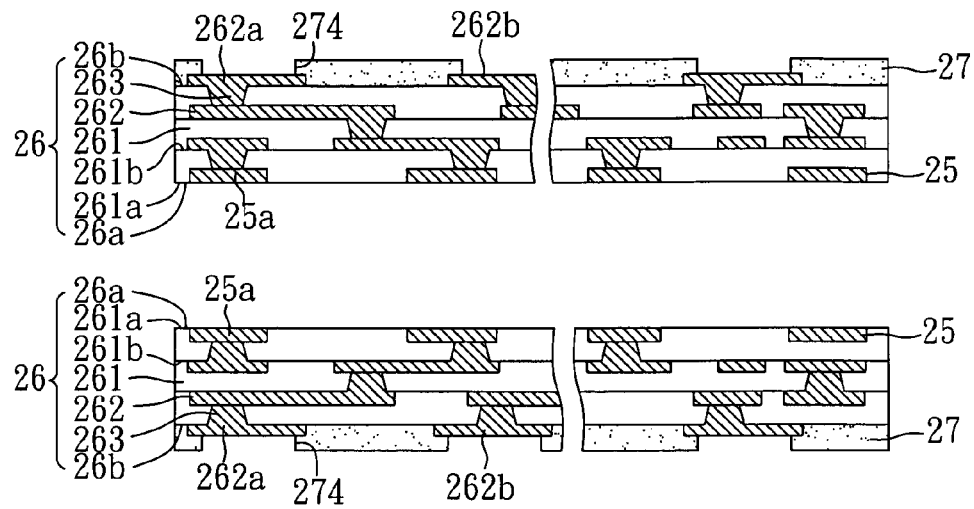
Figure 2H:
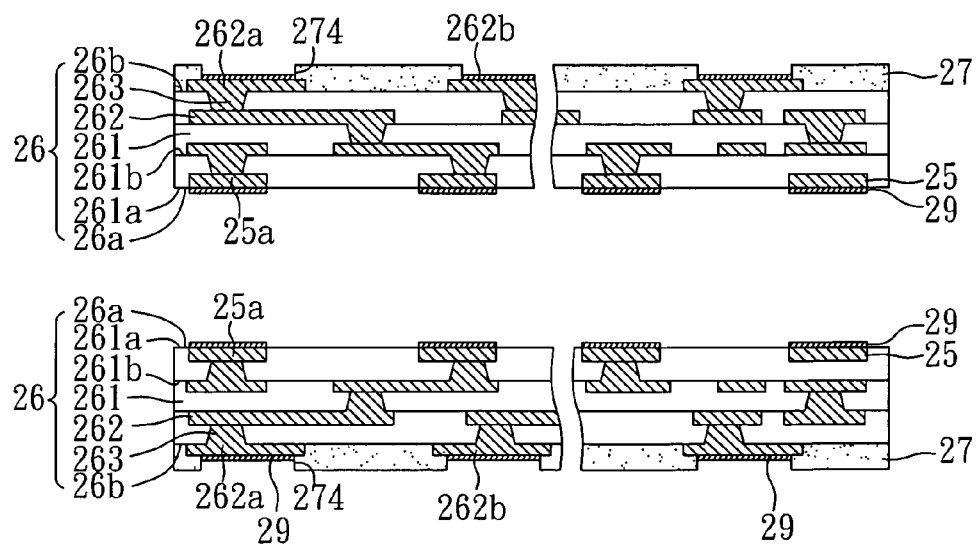
Figure 2H:
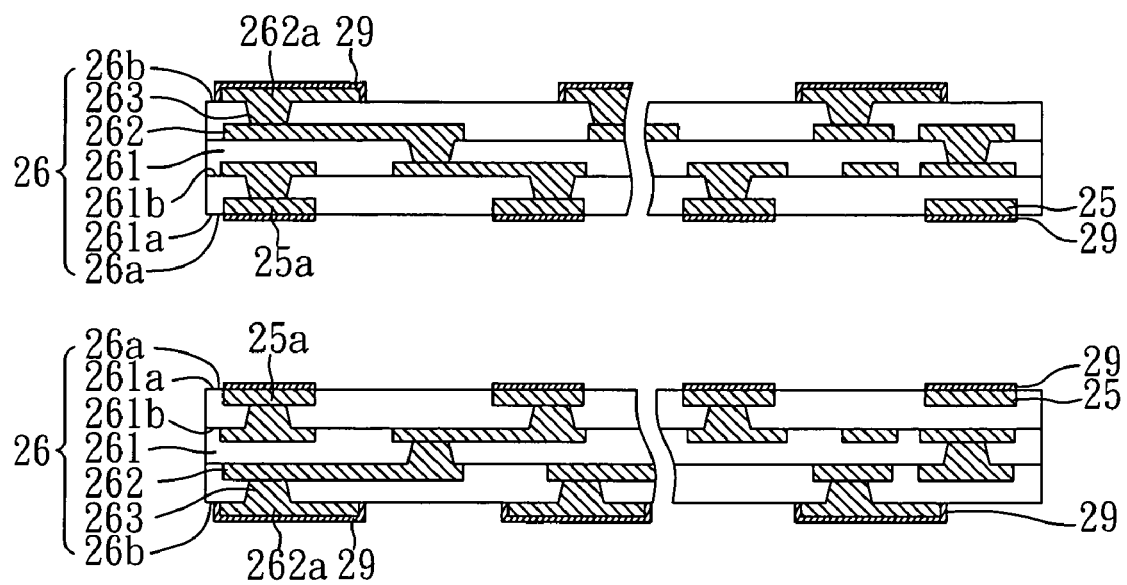

Then, along dashed lines near the exterior of the whole-panel shown in FIG. 2E (corresponding to or inside a border of the releasing film 22), the built-up structure 26, the metal layer 23, the releasing film 22, and the first dielectric layer 21 are all cut to form a structure shown in FIG. 2F. Subsequently, as shown in FIG. 2G, the carrier 2 is removed from the built-up structure 26. In other words, the core layer 20, the first dielectric layer 21, and the release film 22 are removed in order from the built-up structure 26. Then, the metal layer 23 is removed by polishing or etching to give a whole-panel coreless packaging substrate. In the coreless packaging substrate, the first conductive pads 25a are embedded in and exposed from the second dielectric layer 261. Finally, as shown in FIG. 2H, a surface finish layer 29 is formed on the first conductive pads 25a and the second conductive pads 262a. A material of the surface finish layer 29 can be one selected from tin, silver, nickel, gold, chromium/titanium, nickel/gold, nickel/palladium, nickel/palladium/gold, OSP, ENIG, ENEPIG, and EPIG.

Furthermore, since many coreless packaging substrate units are disposed on the whole-panel carrier, many coreless packaging substrate units can be obtained after the cutting process.

Hence, the coreless packaging substrate of the present invention is accomplished, and it includes: a built-up structure 26 having a first outside 26a and an opposite second outside 26b, which includes at least one second dielectric layer 261 having a first surface 261a which faces the first outside 26a and a second surface 261b which faces the second outside 26b, at least one second wiring layer 262 disposed on the second surface 261b of the second dielectric layer 261, and a plurality of conductive vias 263 disposed in the second dielectric layer 261, wherein the outermost second wiring layer 262 at the second outside 26b has a plurality of second conductive pads 262a; a first wiring layer 25 embedded in and exposed from the first surface 261a of the outermost second dielectric layer 261 at the first outside 26a of the built-up structure 26, and having a plurality of first conductive pads 25a, wherein the conductive vias 263 of the built-up structure 26 electrically connect the first wiring layer 25 and the second wiring layer 262, or electrically connect the second wiring layers 262, as the built-up structure 26 can have an increased number of layers; and a surface finish layer 29 disposed on the first conductive pads 25a, and disposed on and wrapping the second conductive pads 262a.

If the surface of the packaging substrate only requires the pads but does not require the wiring in the layout, the coreless packaging substrate of the present invention can be appropriately applied. Therefore, the surface finish layer can be formed only on the pads to protect the pads from being damaged by the environment. Other protection layers such as a solder mask need not be additionally formed for protection such that the possibility of the warpage owing to CTE difference of different materials can be decreased and the shortcomings such as poor development of openings in a solder mask at the side for mounting chips, and defective junction of solder bumps can be overcome.

Embodiment 3

The manner of the present embodiment is similar to that of Embodiment 2 except for the following steps.

As shown in FIG. 2E', the outermost second dielectric layer 261 of built-up structure 26 has not only a plurality of second conductive pads 262a but also wirings 262b. An insulating protection layer 27 is formed on the built-up structure 26, and for example, can be a solder mask made of green lacquer or any other dielectric materials commonly used in the present art. According to the material of the insulating protection layer 27, a method such as exposure and development or laser ablation can be performed to form a plurality of openings 274 in the insulating protection layer 27. The openings 274 thus reveal the second conductive pads 262a of the outermost second wiring layer 262.

Then, along dashed lines near the external of the whole-panel shown in FIG. 2E' (corresponding to or inside a border of the releasing film 22), the insulating protection layer 27, the built-up structure 26, the metal layer 23, the releasing film 22, and the first dielectric layer 21 are all cut to form a structure shown in FIG. 2F. Subsequently, as shown in FIG. 2G the carrier 2 is removed from the built-up structure 26 to give a coreless packaging substrate. Finally, as shown in FIG. 2H, a surface finish layer 29 is formed on the first conductive pads 25a and the second conductive pads 262a revealed by the openings 274.

Accordingly, the coreless packaging substrate of the present invention is afforded. The coreless packaging substrate of the present embodiment is similar to that of Embodiment 2 with regard to the configuration. Nevertheless, in the coreless packaging substrate of the present embodiment, the outermost second wiring layer 262 of the built-up structure 26 has the second conductive pads 262a and the wirings 262b, simultaneously. Hence, there is a need to form the insulating protection layer 27 covering the surface of the built-up structure 26 and the wirings 262b of the outermost second wiring layer 262. Furthermore, the second conductive pads 262a revealed by the openings 274 disposed in the insulating protection layer 27, are protected by the surface finish layer 29.

Embodiment 4

With reference to FIGS. 3A to 3G, a flowchart shows a method for manufacturing a coreless packaging substrate of the present invention in a cross-sectional view. In the present embodiment, ball pads embedded in and exposed from the coreless packaging substrate are formed.

Figure 3A:
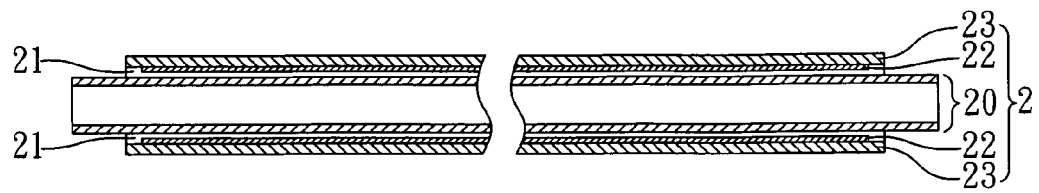
FIGS. 3A to 3H show a flowchart of a method for manufacturing a coreless packaging substrate in a cross-sectional view in Embodiment 4 of the present invention.

First, as shown in FIG. 3A, a carrier 2 is provided. This carrier 2 is the carrier of Embodiment 1 which is used for manufacturing a whole-panel coreless packaging substrate.

Figure 3B:
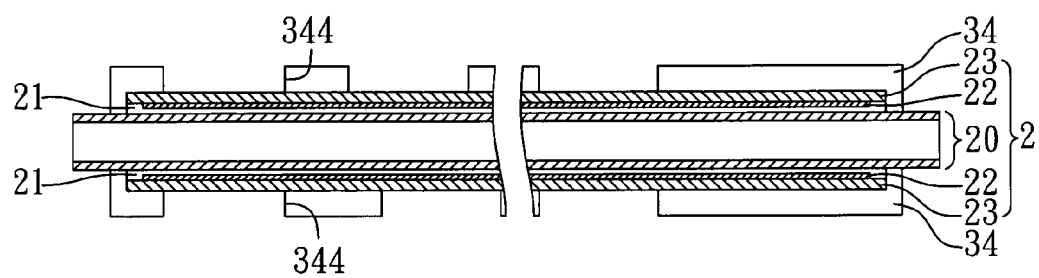
Figure 3C:
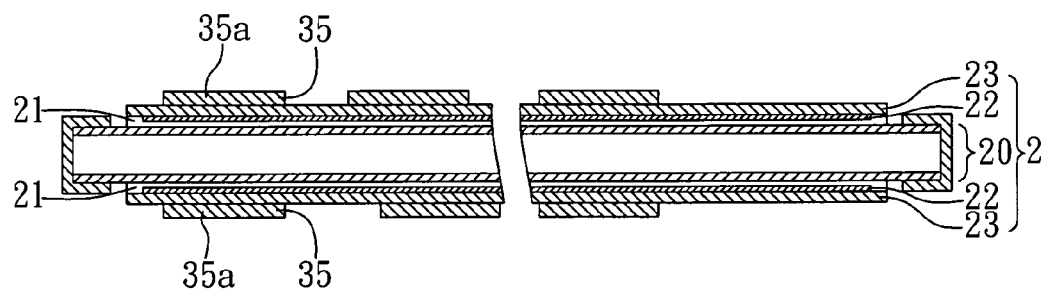
Figure 3D:
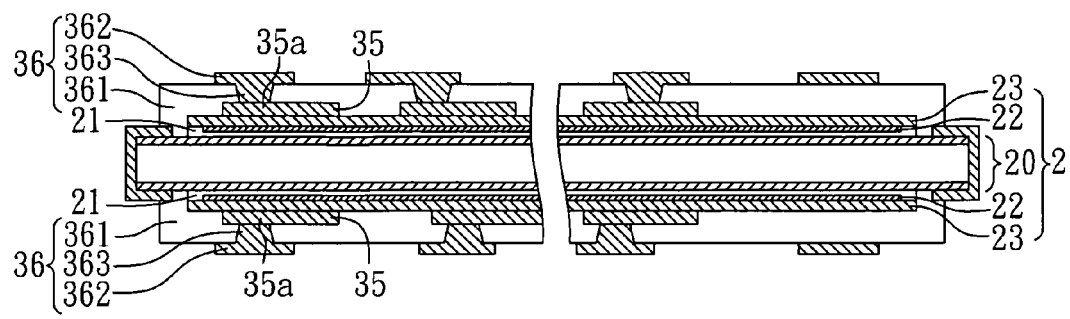

Subsequently, in accordance with the steps of Embodiment 2, with reference to FIGS. 3B and 3C, a first wiring layer 35 having a plurality of first conductive pads 35a is formed by using a resist layer 34 which has an open area 344 and has been patterned by exposure and development. In the present embodiment, the first conductive pads 35a serve as ball pads for electrical connection of a printed circuit board. Then, with reference to FIGS. 3D and 3E, a built-up structure 36 is formed on the first wiring layer 35 and the metal layer 23. The built-up structure 36 includes a second dielectric layer 361, a second wiring layer 362 disposed on the second dielectric layer 361, and a plurality of conductive vias 363 disposed in the second dielectric layer 361. The outermost second wiring layer 362 has a plurality of second conductive pads 362a. In the present embodiment, the second conductive pads 362a serve as bump pads for electrical connection of a semiconductor chip. Afterwards, with reference to FIGS. 3E to 3G, the steps of cutting and removing the carrier 2 are performed to give a coreless packaging substrate. In the coreless packaging substrate, the first conductive pads 35a are embedded in and exposed from the second dielectric layer 361. Finally, as shown in FIG. 3H, a surface finish layer 39 is formed on the first conductive pads 35a and the second conductive pads 362a.

Hence, the coreless packaging substrate of the present invention is completed, and it includes: a built-up structure 36 having a first outside 36a and an opposite second outside 36b, which includes at least one second dielectric layer 361 having a first surface 361a which faces the first outside 36a and a second surface 361b which faces the second outside 36b, at least one second wiring layer 362 disposed on the second surface 361b of the second dielectric layer 361, and a plurality of conductive vias 363 disposed in the second dielectric layer 361, wherein the outermost second wiring layer 362 at the second outside 36b has a plurality of second conductive pads 362a; a first wiring layer 35 embedded in and exposed from the first surface 361a of the outermost second dielectric layer 361 at the first outside 36a of the built-up structure 36, and having a plurality of first conductive pads 35a, wherein the conductive vias 363 of the built-up structure 36 electrically connect the first wiring layer 35 and the second wiring layer 362, or electrically connect the second wiring layers 362, as the built-up structure 36 can have an increased number of layers; and a surface finish layer 39 disposed on the first conductive pads 35a, and disposed on and wrapping the second conductive pads 362a.

It can be seen that the second dielectric layer 361 of the built-up structure and the carrier 2 avoids permeation by the acid solution into the substrate structure in the etching step if the etching step is required during the manufacture of the coreless packaging substrate of the present invention.

Embodiment 5

The manner of the present embodiment is similar to that of Embodiment 4 except for the following steps.

Figure 3E:
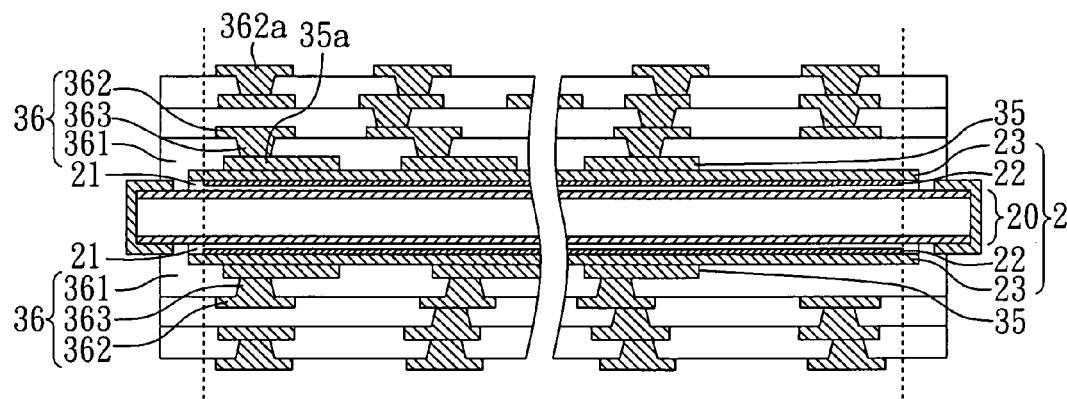
Figure 3E:
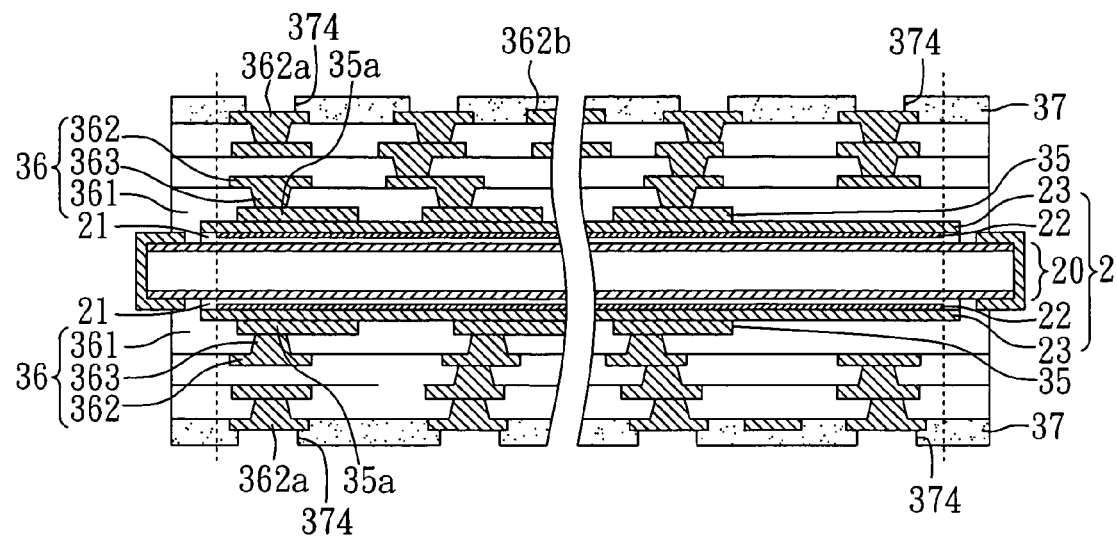

As shown in FIG. 3E', the outermost second dielectric layer 361 of built-up structure 36 has not only a plurality of second conductive pads 362a but also wirings 362b. An insulating protection layer 37 is formed on the built-up structure 36, and a plurality of openings 374 are formed in the insulating protection layer 37. The openings 374 thus reveal the second conductive pads 362a of the outermost second wiring layer 362.

Figure 3F:
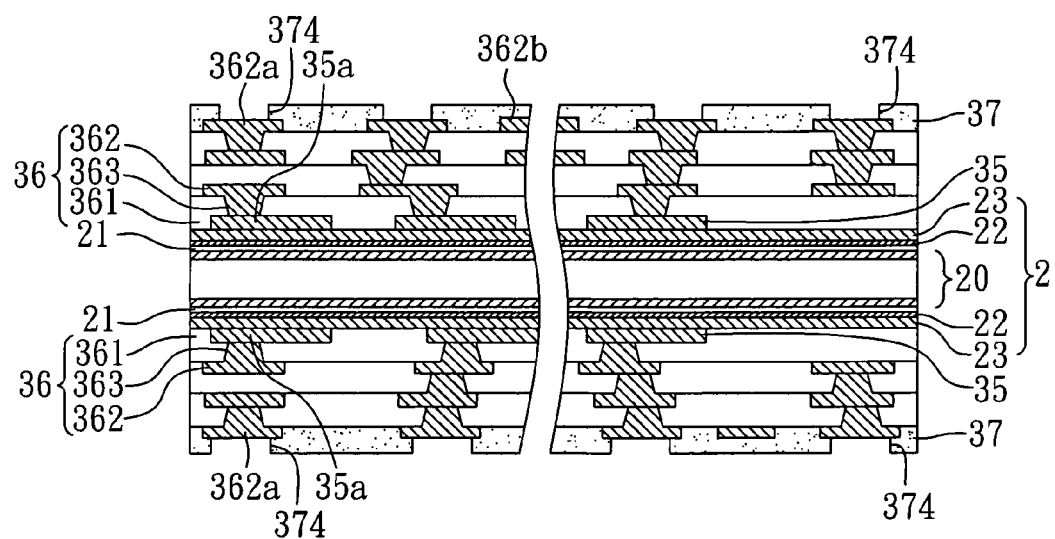
Figure 3F:
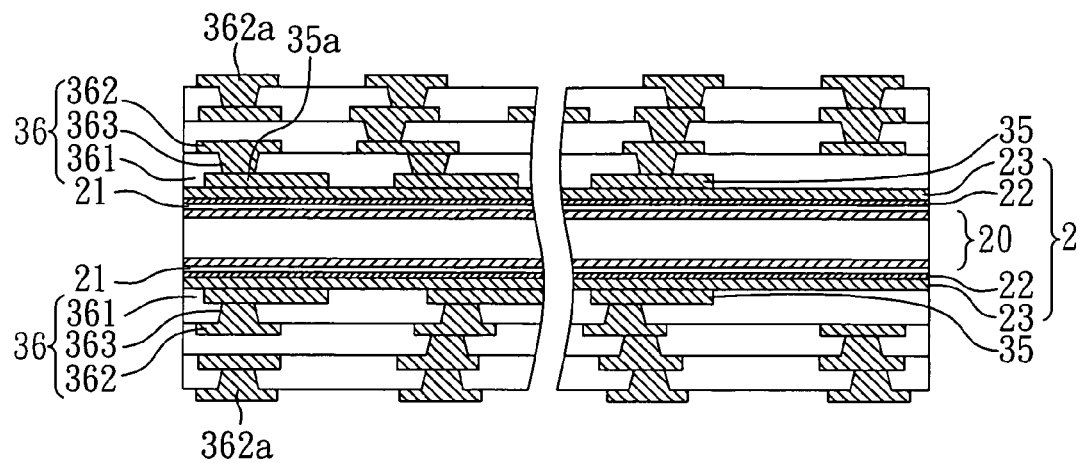
Figure 3G:
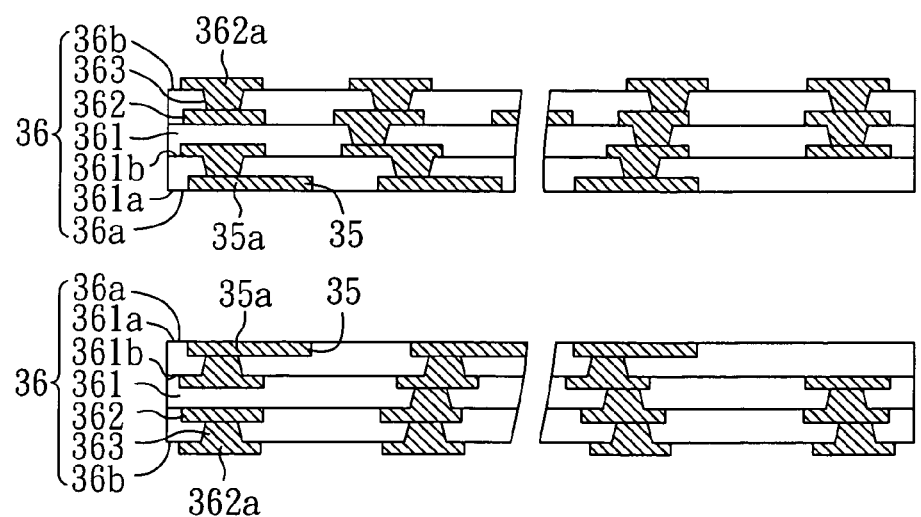
Figure 3G:
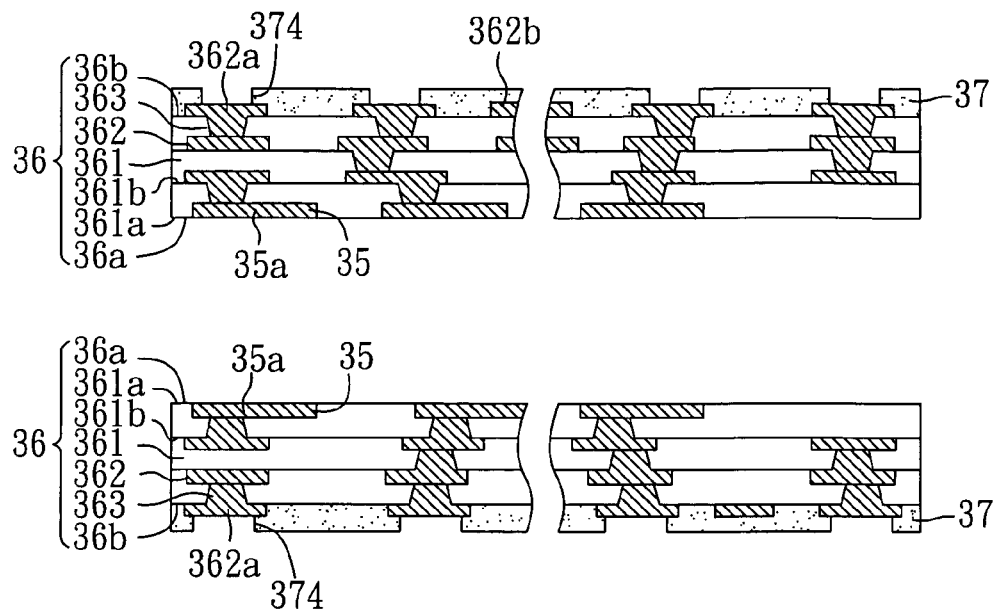
Figure 3H:
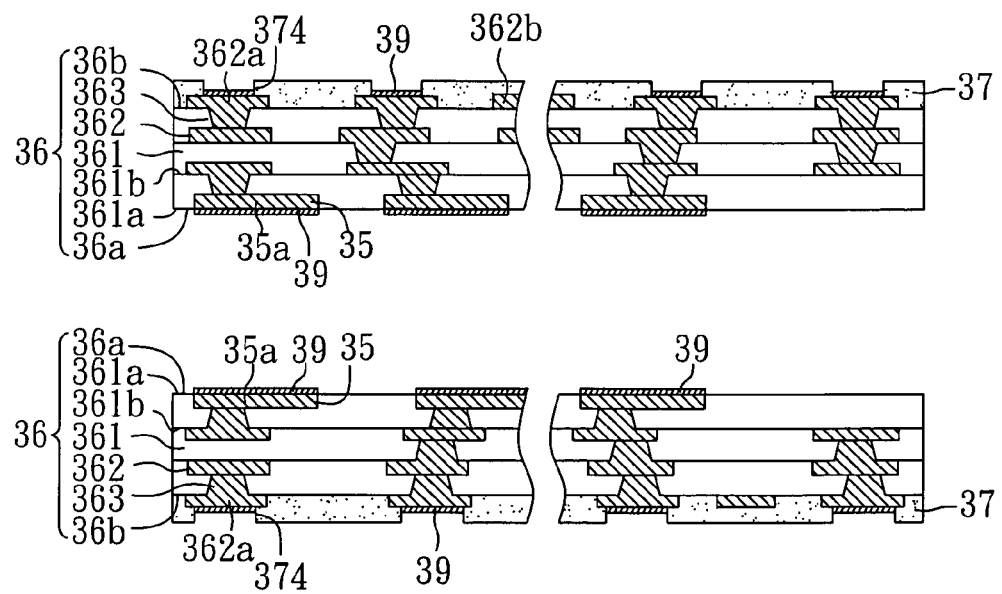
Figure 3H:
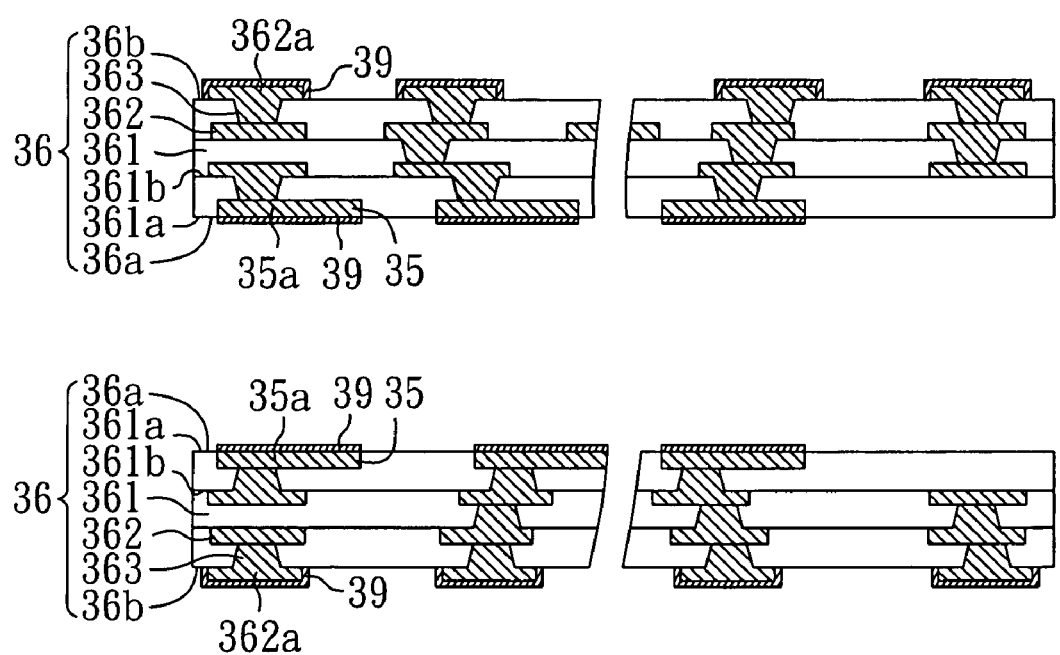

Then, along dashed lines near the external of the whole panel (corresponding to or inside a border of the releasing film 22), the insulating protection layer 37, the built-up structure 36, the metal layer 23, the releasing film 22, and the first dielectric layer 21 are all cut to form a structure shown in FIG. 3F'. Subsequently, as shown in FIG. 3G', the carrier 2 is removed from the built-up structure 36 to give a coreless packaging substrate. Finally, as shown in FIG. 3H', a surface finish layer 39 is formed on the first conductive pads 35a and the second conductive pads 362a revealed by the openings 374.

Accordingly, the coreless packaging substrate of the present invention is obtained. The coreless packaging substrate of the present embodiment is similar to that of Embodiment 4 with regard to the configuration. Nevertheless, in the coreless packaging substrate of the present embodiment, the outermost second wiring layer 362 of the built-up structure 36 has the second conductive pads 362a and the wirings 362b, simultaneously. Hence, there is a need to form the insulating protection layer 37 covering the surface of the built-up structure 36 and the wirings 362b of the outermost second wiring layer 362. Furthermore, the second conductive pads 362a revealed by the openings 374 disposed in the insulating protection layer 37, are protected by the surface finish layer 39.

Embodiment 6

The manner of the present embodiment is similar to that of Embodiment 5 except for the following steps.

As shown in FIG. 3E", plated metal bumps 38 are formed by electroplating on the second conductive pads 362a revealed by the openings 374 after the insulating layer 37 having openings 374 is formed. The plated metal bumps can be made of any conventional material composing wirings.

Then, as shown in FIGS. 3F" and 3G", the step of cutting is performed. Finally, as shown in FIG. 3H", a surface finish layer 39 is formed on the first conductive pads 35a and the plated metal bumps 38 to give a coreless packaging substrate. Herein, the plated metal bumps 38 function to electrically connect a semiconductor chip.

Although the present invention has been explained in relation to its preferred embodiment, it is to be understood that many other possible modifications and variations can be made without departing from the scope of the invention as hereinafter claimed.

What is claimed is:

1. A method for manufacturing a coreless packaging substrate, comprising the following steps:
providing a carrier, which comprises a core layer, a first dielectric layer disposed on the core layer, a release film disposed on the first dielectric layer, and a metal layer disposed on the release film and the first dielectric layer, wherein an area of the release film is smaller than that of the first dielectric layer such that the first dielectric layer has a frame-shaped region not covered by the release film and the metal layer is connected with the frame-shaped region by overlapping;
forming a first wiring layer on the metal layer of the carrier, wherein the first wiring layer has a plurality of first conductive pads;
forming a built-up structure on the first wiring layer and the metal layer, wherein the built-up structure comprises at least one second dielectric layer, at least one second wiring layer disposed on the second dielectric layer, and a plurality of conductive vias disposed in the second dielectric layer, wherein the conductive vias electrically connect the first wiring layer and the second wiring layer, and the outermost second wiring layer has a plurality of second conductive pads; and
cutting the built-up structure, the metal layer, the releasing film, and the first dielectric layer along a border of the releasing film, and removing the carrier from the built-up structure such that the first conductive pads are embedded in and exposed from the second dielectric layer.

2. The method as claimed in claim 1, further comprising the step: forming a surface finish layer on the first and second conductive pads.

3. The method as claimed in claim 2, wherein the surface finish layer is made of one selected from tin, silver, nickel, gold, chromium/titanium, nickel/gold, nickel/palladium, nickel/palladium/gold, organic solderability preservatives (OSP), electroless nickel/immersion gold (ENIG), electroless nickel/electroless palladium/immersion gold (ENEPIG), and electroless palladium/immersion gold (EPIG).

4. The method as claimed in claim 1, wherein the second dielectric layer which the first conductive pads are embedded in and exposed from has a coefficient of thermal expansion (CTE) ranging from 10 to 30 ppm/° C., and a Young's modulus over 8 Gpa.

5. The method as claimed in claim 1, wherein the core layer is a copper-clad laminate.

6. The method as claimed in claim 1, wherein the first conductive pads are bump pads, and the second conductive pads are ball pads.

7. The method as claimed in claim 1, wherein the first conductive pads are ball pads and the second conductive pads are bump pads.

8. A method of manufacturing a coreless packaging substrate, comprising the following steps:
providing a carrier, which comprises a core layer, a first dielectric layer disposed on the core layer, a release film disposed on the first dielectric layer, and a metal layer disposed on the release film and the first dielectric layer, wherein an area of the release film is smaller than that of the first dielectric layer such that the first dielectric layer has a frame-shaped region not covered by the release film and the metal layer is connected with the frame-shaped region by overlapping;
forming a first wiring layer on the metal layer of the carrier, wherein the first wiring layer has a plurality of first conductive pads;
forming a built-up structure on the first wiring layer and the metal layer, wherein the built-up structure comprises at least one second dielectric layer, at least one second wiring layer disposed on the second dielectric layer, and a plurality of conductive vias disposed in the second dielectric layer, wherein the conductive vias electrically connect the first wiring layer and the second wiring layer, and the outermost second wiring layer has a plurality of second conductive pads;
forming an insulating protection layer, wherein the insulating protection layer has a plurality of openings exposing the second conductive pads of the outermost second wiring layer; and
cutting the insulating protection layer, the built-up structure, the metal layer, the releasing film, and the first dielectric layer along a border of the releasing film, and removing the carrier from the built-up structure such that the first conductive pads are embedded in and exposed from the second dielectric layer.

9. The method as claimed in claim 8, further comprising the step: forming a surface finish layer on the second conductive pads exposed from the openings and the first conductive pads.

10. The method as claimed in claim 8, further comprising the step: forming a plurality of plated metal bumps on the second conductive pads exposed from the openings before cutting.

11. The method as claimed in claim 10, further comprising the step: forming a surface finish layer on the plated metal bumps and the first conductive pads.

12. The method as claimed in claim 8, wherein the second dielectric layer which the first conductive pads are embedded in and exposed from has a coefficient of thermal expansion (CTE) ranging from 10 to 30 ppm/° C., and a Young's modulus over 8 Gpa.

13. The method as claimed in claim 8, wherein the core layer is a copper-clad laminate.

14. The method as claimed in claim 8, wherein the first conductive pads are bump pads, and the second conductive pads are ball pads.

15. The method as claimed in claim 8, wherein the first conductive pads are ball pads and the second conductive pads are bump pads.

* * * * *